United States Patent [19]
Cutler et al.

[11] Patent Number: 5,847,960
[45] Date of Patent: Dec. 8, 1998

[54] MULTI-TOOL POSITIONING SYSTEM

[75] Inventors: Donald R. Cutler; Robert M. Pailthorp, both of Portland; Mark A. Unrath, Aloha; Thomas W. Richardson; Alan J. Cable, both of Beaverton, all of Oreg.

[73] Assignee: Electro Scientific Industries, Inc., Portland, Oreg.

[21] Appl. No.: 728,619

[22] Filed: Oct. 10, 1996

Related U.S. Application Data

[63] Continuation-in-part of Ser. No. 615,049, Mar. 12, 1996, Pat. No. 5,754,585, which is a continuation-in-part of Ser. No. 408,558, Mar. 20, 1995, abandoned.

[51] Int. Cl.[6] .......................... G06F 19/00; G06G 7/64; G06G 7/66
[52] U.S. Cl. .................. 364/474.29; 364/167.03; 364/474.28; 364/474.35; 364/474.36
[58] Field of Search .................... 364/474.16, 474.29, 364/474.17, 176, 167.02, 167.03, 167.04, 167.1, 474.18, 474.35, 474.28, 474.36, 474.37, 474.14, 474.12; 318/592, 593, 594, 632

[56] References Cited

U.S. PATENT DOCUMENTS

| | | | |
|---|---|---|---|
| 4,326,824 | 4/1982 | Lasermann et al. | 409/132 |
| 4,532,402 | 7/1985 | Overbeck | 219/121 LU |
| 4,616,326 | 10/1986 | Meier et al. | 364/513 |
| 4,618,938 | 10/1986 | Sandland et al. | 364/552 |
| 4,681,452 | 7/1987 | Watanabe | 356/375 |
| 4,873,478 | 10/1989 | Weiss | 318/779 |
| 4,876,656 | 10/1989 | Leicht et al. | 364/491 |
| 4,941,082 | 7/1990 | Pailthorp et al. | 364/167.01 |
| 4,977,494 | 12/1990 | Gabaldon et al. | 364/167.01 |
| 4,990,840 | 2/1991 | Migda | 318/571 |
| 5,126,648 | 6/1992 | Jacobs | 318/640 |
| 5,220,262 | 6/1993 | Kneifel, II et al. | 318/569 |
| 5,255,199 | 10/1993 | Barkman et al. | 364/474.17 |
| 5,262,707 | 11/1993 | Okazaki et al. | 318/592 |
| 5,315,526 | 5/1994 | Maeda et al. | 364/474.28 |
| 5,377,096 | 12/1994 | Ono | 364/176 |
| 5,452,275 | 9/1995 | Ogawa | 369/44.11 |
| 5,453,594 | 9/1995 | Konecny | 219/121.61 |
| 5,453,933 | 9/1995 | Wright et al. | 364/474.23 |

FOREIGN PATENT DOCUMENTS

| | | | |
|---|---|---|---|
| 0297360 | 1/1989 | European Pat. Off. | A61B 17/36 |
| 0527248 | 2/1993 | European Pat. Off. | G05B 19/417 |
| 3714504 | 4/1987 | Germany | B23K 26/00 |
| 4016088 | 5/1990 | Germany | H05K 3/46 |

*Primary Examiner*—Reba I. Elmore
*Assistant Examiner*—Ramesh Patel
*Attorney, Agent, or Firm*—Stoel Rives LLP

[57] ABSTRACT

A multi-rate, multi-head positioner (150) receives and processes unpanelized positioning commands to actuate slow stages (56, 58) and multiple fast stages (154) that are mounted on one of the slow stages to simultaneously position multiple tools (156) relative to target locations (162) on multiple associated workpieces (152). Each of the fast stages is coupled to a fast stage signal processor (172) that provides corrected position data to each fast stage positioner to compensate for fast stage nonlinearities and workpiece placement, offset, rotation, and dimensional variations among the multiple workpieces. When cutting blind via holes in etched circuit boards (ECBs), improved throughput and process yield are achieved by making half of the tools ultraviolet ("UV") lasers, which readily cut conductor and dielectric layers, and making the other half of the tools are infrared ("IR") lasers, which readily cut only dielectric layers. The UV lasers are controlled to cut an upper conductor layer and a portion of an underlying dielectric layer, and the IR lasers are controlled to cut the remaining dielectric layer without cutting through or damaging a second underlying conductor layer. The throughput is increased by cutting conductor layers in unprocessed ECBs while concurrently cutting dielectric layers in ECBs that have already had their conductor layer cut. The process yield is increased by performing a workpiece calibration prior to each cutting step to account for any ECB placement, offset, rotation, and dimensional variations.

34 Claims, 7 Drawing Sheets

MULTI-TOOL POSITIONING SYSTEM

RELATED APPLICATION

This application is a continuation-in-part of U.S. patent application Ser. No. 08/615,049, filed Mar. 12, 1996 now U.S. Pat. No. 5,754,585, which is a continuation-in-part of U.S. patent application Ser. No. 08/408,558, filed Mar. 20, 1995 now abandoned.

TECHNICAL FIELD

This invention relates to an apparatus and a method for positioning multiple "tools," such as laser beams or other radiation beams, relative to target locations on multiple associated workpieces and, in particular, to a system that accurately coordinates the positioning of the multiple tools and associated target locations with a multi-stage, multi-head positioner.

BACKGROUND OF THE INVENTION

A variety of technologies employ tools to micro-machine, or deposit patterns or materials on target locations on a workpiece. For example, micro-dimensioned drills may be used to form a cradle for a micro-dimensioned motor; a micro-dimensioned punch may be used to punch holes in a thin metal plate; a laser may be used to precisely machine or selectively erode metallic, crystalline, or amorphous specimens; and ion beams may be used to selectively implant charged particles into an integrated circuit. All of the above-mentioned processes share a common requirement for accurately and rapidly positioning a pertinent tool to target locations on the workpiece.

In some high volume production applications, multiple tools are simultaneously positioned relative to multiple corresponding workpieces to improve the processing throughput and reduce total manufacturing cost. One such application employs a multiple spindle drilling machine to simultaneously drill identical sets of holes in multiple circuit boards. Such machines have high throughput but require accurate fixturing of the multiple workpieces, cannot compensate for dimensional differences among the workpieces, and are subject to frequent downtime for drill replacement.

In a related application, prior workers have employed lasers to machine via holes between the upper layers of a multilayer circuit board. Such machines have high accuracy and do not require drill replacement, but they do not have the high throughput of multiple spindle drilling machines.

In addition, two emerging, but opposing, requirements exist for coordinating the relative motion between tools and workpieces. Namely, feature sizes are decreasing, causing the need for dimensional precision to increase, while at the same time the overall size of workpieces is increasing. Consequently, the accuracy, size, and speed requirements imposed on tool positioners are taxing the limits of existing positioning systems.

Existing positioners are typically characterized by low speed and long movement or high speed and short movement. Low-speed and long-movement positioners, such as X–Y translation tables, are characterized by high positional accuracy; whereas high-speed, short-movement positioners, such as galvanometer-driven beam deflectors, are characterized by deflection angle nonlinearities.

A solution for long-movement, high-speed positioning is described in U.S. Pat. No. 4,532,402 issued Jul. 30, 1985 for METHOD AND APPARATUS FOR POSITIONING A FOCUSED BEAM ON AN INTEGRATED CIRCUIT in which a high-speed short-movement positioner ("fast positioner"), such as a galvanometer, is combined with a long-movement, low-speed, but high-accuracy positioner ("slow positioner") such as an X–Y translation table. The two positioners are capable of combining short and rapid movement with long and accurate movement to accurately and rapidly position a tool, such as a laser beam, to target locations on a workpiece, such as an integrated circuit or an etched circuit board. The combined movement of the two positioners entails first moving the slow positioner to a known location near a target location on the workpiece, stopping the slow positioner, moving the fast positioner to the exact target location, stopping the fast positioner, causing the tool to operate on the target location, and then repeating the process for the next target location.

However, such a positioning method has serious drawbacks. Clearly, all the starting and stopping causes delays that unduly increase the time required for the tool to process the workpiece. A serious drawback is also imposed upon the computer-based machine tool control file or "database" that typically commands the tool to move to a series of predetermined target locations across the workpiece.

This drawback can be illustrated by the laser machining of a workpiece such as, for example, an integrated circuit of a type having a regular pattern of small features requiring trimming by a laser beam. The positioner and laser beam will cooperate efficiently if the slow positioner can accurately move the laser beam from pattern to pattern and the fast positioner can rapidly direct the laser beam to all of the small features requiring trimming within each pattern.

If, however, the size of the largest pattern exceeds the movement range of the fast positioner, the database positioning the tool across the workpiece must be "panelized" into abutting segments that each fit within the movement range of the fast positioner. The above-described trend toward increased dimensional precision and larger workpieces virtually guarantees the need for panelized databases. Panelization allocates the conflicting tasks of short, high-speed positioning and long, high-accuracy positioning into appropriate movement assignments for the fast and slow positioners.

Figure 1:
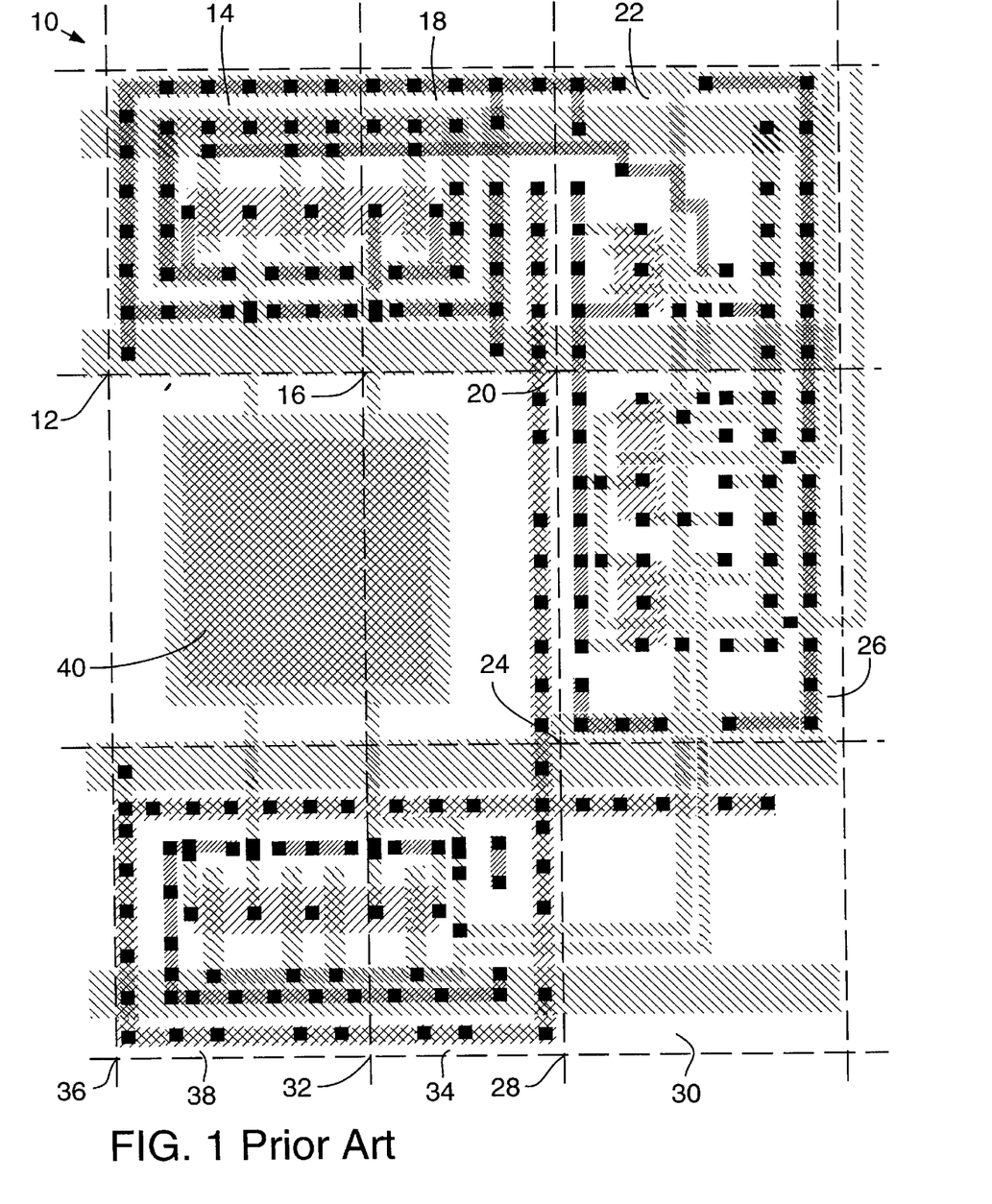
FIG. 1 is a pictorial plan view of an integrated circuit work field panelized for tool processing according to a prior art positioner movement panelization scheme.

For example, FIG. 1 shows a portion of an integrated circuit 10 having a substantially regular pattern of transistors and associated electrical interconnections that are amenable to processing with an ion implantation tool positioned by a panelized database. In this example, the threshold voltages of selected transistors are adjusted by controllably implanting boron ions into appropriate p-channel substrate regions of integrated circuit 10. The substrate areas to be doped cover a larger area than the movement range of the fast positioner. Therefore, the slow positioner drives the ion implantation tool into relative alignment with integrated circuit 10 at an origin 12 of a panel 14 (panels shown in dashed lines) after which movement the fast positioner executes the relatively short movements required between the ion implantation tool and integrated circuit 10 to process the substrate areas within panel 14 commanded by the database. After panel 14 is processed, the slow positioner moves the ion implantation tool into relative alignment with integrated circuit 10 at an origin 16 of a panel 18 after which movement the fast positioner executes the relatively short movements required between the ion implantation tool and integrated circuit 10 to process the substrate areas within panel 18 as commanded by the database.

The above-described process is repeated by stepping through origins 20, 24, 28, 32, and 36 of respective panels 22, 26, 30, 34, and 38 until integrated circuit 10 has been completely processed. Note that an interconnect pad 40 is not completely enclosed within a single panel. Fortunately in this instance, interconnect pad 40 requires no ion implantation processing and can be ignored for panelization purposes.

Database panelization is at best an inefficient, approximate optimization that divides the tool path into several predetermined compartmentalized small movement command clusters that are inherently inefficient because the movements are executed incrementally.

Panelization also depends on the movement capacities of the particular positioners employed and the type of tool being positioned. For example, the panels assigned to integrated circuit 10 must be delineated in the database not only according to the pattern regularity of integrated circuit 10, but also according to the movement range of the fast positioner and specific target locations assigned to the ion implantation tool. If the tool type is changed, a different positioner type may be required that processes different features at different target locations. Either change would probably require that the database be repanelized to accommodate the new positioner and tool.

Panelization further requires that each panel within a database must abut adjacent panels within the workpiece without causing a tool operation to straddle or overlap a panel boundary. In the example of integrated circuit 10, if instead of an ion implantation tool a laser beam tool was employed to process metalization of interconnect pad 40, the panelization shown in FIG. 1 may not be suitable because interconnect pad 40 straddles two panels. The same problem can occur if the workpiece includes irregular patterns, such as target locations for drilling holes in an etched circuit board. Some workpiece and tool type combinations are simply not conducive to panelization. And, of course, pattern regularity may repeat, albeit at a dimensional distance greater than the movement range of a particular fast positioner. Adapting a fast positioner having a sufficiently large movement range may be counter-productive because of added mass and nonlinearities.

What is needed, therefore, is a high throughput apparatus and method for accurately positioning a wide variety of tools relative to a wide variety of workpieces without requiring a panelized tool path database.

SUMMARY OF THE INVENTION

An object of this invention is, therefore, to provide an improved apparatus and method for automatically and optimally allocating database positioning commands among multiple positioners in a multi-tool processing system.

Another object of this invention is to provide an apparatus and a method for performing tool path operations simultaneously on multiple workpieces without requiring a panelized database.

A further object of this invention is to provide an apparatus and a method for improving the accuracy and throughput of multiple simultaneous tool path operations employing a multi-rate positioning system.

A multi-rate positioner system of this invention receives unpanelized positioning commands from a database, profiles the commands into half-sine positioning signals, and further processes the half-sine positioning signals into low-frequency and high-frequency positioning signals for actuating respective slow and fast positioners to target locations specified by the database. The slow and fast positioners move, without necessarily stopping, in response to a stream of positioning command data while coordinating their individually moving positions to produce temporarily stationary tool positions over target locations defined by the database. The multi-rate positioning system reduces the fast positioner movement range requirement while providing significantly increased tool processing throughput without requiring a panelized database.

The half-sine positioning signal is divided into acceleration and position components. High tool processing throughput is achieved by passing the position component through a fourth-order profiling filter that has a fixed delay and produces low-frequency position and acceleration components for driving the slow positioner. The unfiltered position and acceleration components are delayed by the same amount as the fixed delay to produce high-frequency position and acceleration components for driving the fast positioner. Slow positioner errors caused by nonresponsiveness of the slow positioner to fast stage components fed through the profiling filter are corrected by directing these feedthrough-related errors to the fast positioner as part of the fast positioner command. Positioning errors caused by inertia and friction associated with the positioners are corrected by comparing the actual tool position with a commanded tool position in feedback networks that modify the slow and fast stage positioning signals.

A multi-rate, multi-head positioner embodiment of this invention receives and processes the unpanelized positioning commands as above to actuate the slow positioner and multiple fast positioners that are mounted on the slow positioner to simultaneously position multiple tools relative to target locations on multiple associated workpieces. Each of the fast positioners is coupled to a fast stage signal processor that provides corrected position data to each fast stage positioner to compensate for fast stage nonlinearities and workpiece placement, offset, rotation, and dimensional variations among the multiple workpieces.

The multi-rate, multi-head positioner system reduces workpiece processing cost and improves workpiece processing throughput by simultaneously processing multiple workpieces with a single system. Moreover, processed workpiece rejects are reduced because of the ability to process workpieces having placement, offset, rotation, and dimensional variations.

A preferred embodiment of the multi-rate, multi-head positioner cuts blind via holes in etched circuit boards ("ECBs") with improved throughput and process yield. In this embodiment, half of the tools are ultraviolet ("UV") lasers, which readily cut conductor and dielectric layers, and the other half of the tools are infrared ("IR") lasers, which readily cut only dielectric layers. The UV lasers are controlled to cut an upper conductor layer and a portion of an underlying dielectric layer, and the IR lasers are controlled to cut the remaining dielectric layer without cutting through or damaging a second underlying conductor layer. The combined laser processing steps have a wide process window for cutting blind via holes in ECBs. Moreover, the throughput is increased by cutting conductor layers in unprocessed ECBs while concurrently cutting dielectric layers in ECBs that have already had their conductor layer cut. The process yield is increased by performing a workpiece calibration prior to each cutting step to account for any ECB placement, offset, rotation, and dimensional variations.

Additional objects and advantages of this invention will be apparent from the following detailed description of preferred embodiments thereof, which proceed with reference to the accompanying drawings.

DETAILED DESCRIPTION OF PREFERRED EMBODIMENTS

Figure 2:
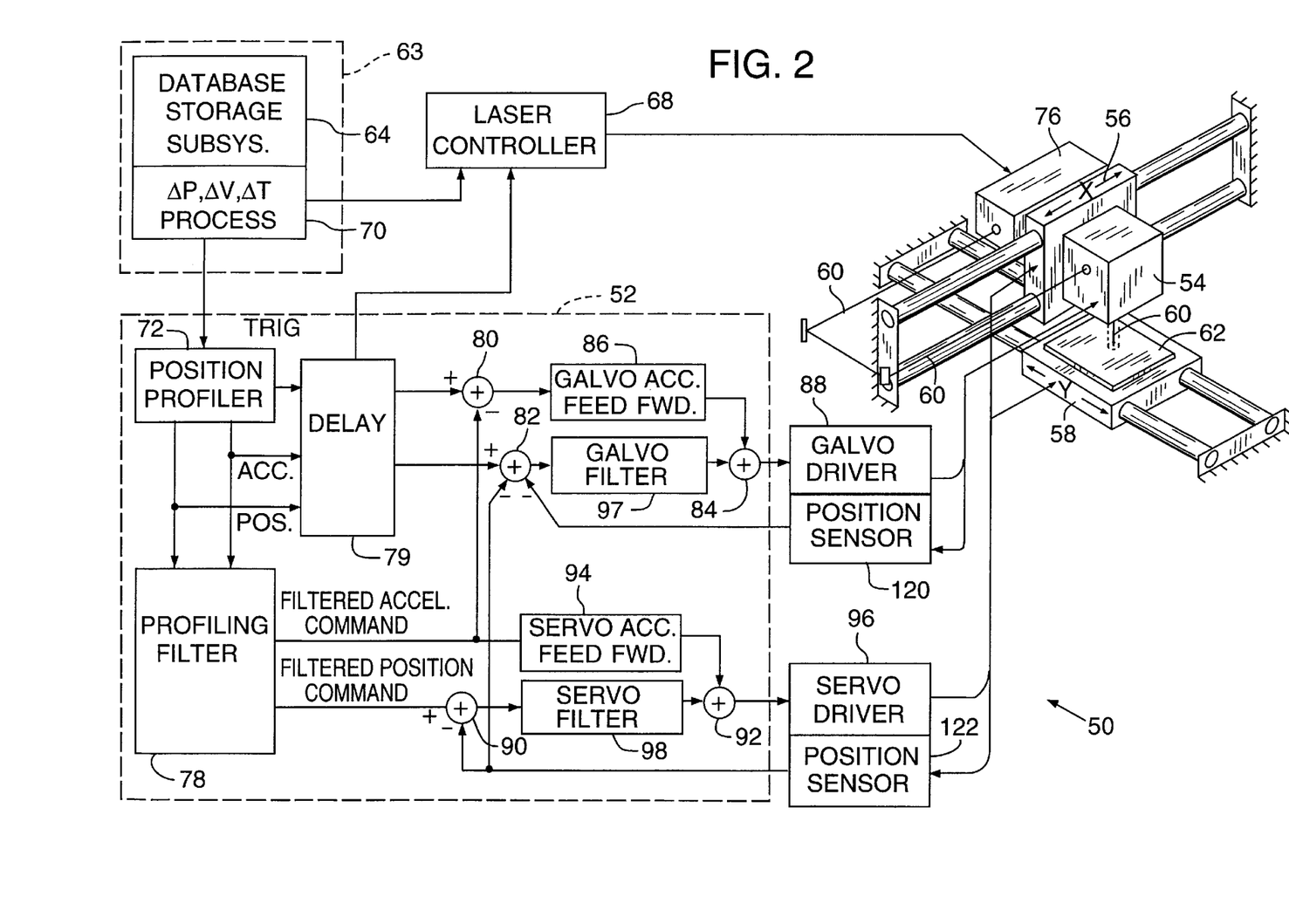
FIG. 2 is a pictorial block diagram of a multi-stage laser beam positioning system of this invention.

FIG. 2 shows a multi-stage tool positioner system 50 having positioning command execution capabilities in accordance with this invention. Positioner system 50 is described only by way of example with reference to a single-head, laser-based hole cutting system that employs a digital signal processor ("DSP") 52 to control a fast galvanometer positioner stage 54 ("fast stage 54"), a slow X-axis translation stage 56 ("slow stage 56"), and a slow Y-axis translation stage 58 ("slow stage 58") to direct a laser beam 60 to target locations on a single workpiece 62, such as an etched circuit board. Although positioner system 50 is configured with single fast stage 54 mounted on slow stage 56 and a single workpiece 62 mounted on slow stage 58, other configurations of tool positioning systems, such as one in which multiple fast stages 54 are mounted on slow stage 56 and multiple workpieces 62 are mounted on slow stage 58, may advantageously employ this invention.

A system control computer 63 processes a tool path database stored in a database storage subsystem 64. The database contains the desired processing parameters for cutting holes and/or profiles with laser beam 60 in workpiece 62. The database is conventionally compiled using a tool path generating program, such as SMARTCAM™ manufactured by Camex Manufacturing Technologies located in Eugene, Oreg. System control computer 63 conveys parsed portions of the stored database to a laser controller 68 and position control portions of the database as a data stream to a delta process 70. Delta process 70 resolves the data stream into delta position ("dx" and "dy"), delta velocity ("dv"), and delta time ("dt") components for each intended change in the path of laser beam 60 across workpiece 62. Consequently, each movement of laser beam 60 is defined in dx, dy, dv, and dt components that are further processed by a position profiler 72 into a half-sine profiled positioning signal.

Laser controller 68 is controlled by timing data generated by delta process 70 and further coordinated by a triggering process that synchronizes the firing of a laser 76 to the motion of fast stage 54 and slow stages 56 and 58 according to a synchronization technique, such as one described in U.S. Pat. No. 5,453,594, issued Sep. 26, 1995, for RADIATION BEAM POSITION AND EMISSION COORDINATION SYSTEM, which is assigned to the assignee of this application.

Figure 3A:
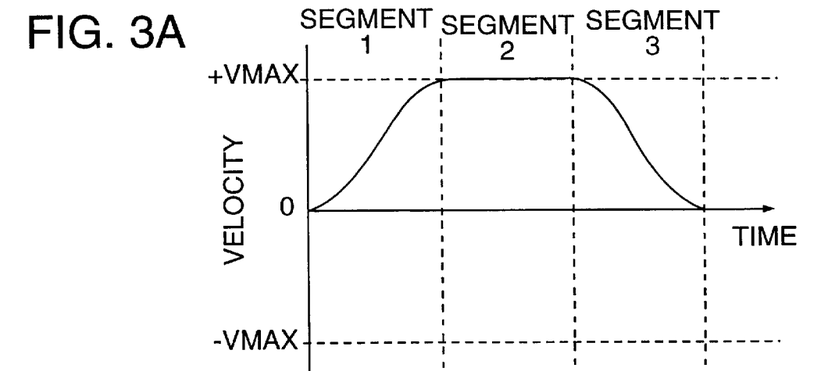
FIGS. 3A and 3B are time versus velocity graphs showing respective two- and three-segment positioner velocity profiles processed from positioning commands according to this invention.
Figure 3B:
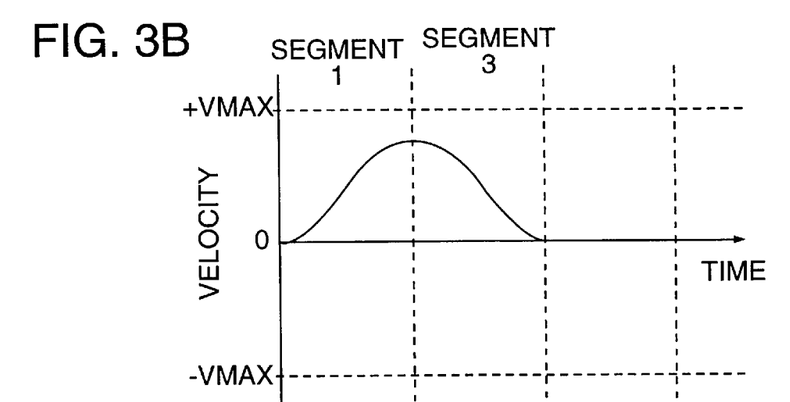

Delta process 70 generates the dx, dy, dv, and dt components in accordance with a preferred BASIC language signal processing procedure described below with reference to FIGS. 3A and 3B.

Before calling the preferred procedure, referred to as "gen_move," limiting values for maximum acceleration (amax), maximum velocity (vmax), and minimum time (tmin) are initialized. The limiting values are physical hardware limits imposed by the particular positioner hardware (fast or slow) that is required to move a majority of the distance in response to a particular positioning command. For example, if the movement distance is less than 25 percent of the maximum fast positioner movement range, then the values are set for the fast positioner. Otherwise the values are set for the slow positioner. Limiting values for fast stage 54 and slow stages 56 and 58 are:

|  | Fast | Slow |
|---|---|---|
| vmax (Meters/Second) | 1 | 0.25 |
| amax (g) | 50 | 1.0 |
| tmin (Milliseconds) | 2 | 20.0 |

Procedure gen_move calculates the dx, dy, dv, and dt values required for a positioner stage to move in either two or three movement segments from any initial position and initial velocity to any final position and final velocity.

All movement segments include some combination of a half-sine profiled acceleration segment ("segment 1"), a constant velocity segment ("segment 2"), and a half-sine profiled deceleration segment ("segment 3"). As shown in FIG. 3A, when a positioning command is sufficiently large to cause the positioner velocity to reach either +vmax or −vmax, segment 2 is included between segments 1 and 3. Otherwise, as shown in FIG. 3B, a two-segment movement command is executed that includes only segments 1 and 3 (segment 2 equals 0). Procedure gen_move generally conforms to, and skilled workers will readily understand, the following BASIC language description.

```
PROCEDURE gen_move (g&,h&):

REMARK    "g" and "h" are pointers into an indexed array of positions
and velocities extracted from the database.

xi=px(g&)      !initial x position   !um
yi=py(g&)      !initial y position
xvi=vx(g&)     !initial x velocity   !um/sec
yvi=vy(g&)     !initial y velocity xf=px(h&)      !final x position
yf=py(h&)      !final y position
xvf=vx(h&+1)   !final x velocity
yvf=vy(h&+1)   !final y velocity REMARK    Calculate the maximum (or minimum) absolute for X and
Y movement based on the total change in position, initial and final veloci-
ties, and the minimum movement time (limited to vmax).
dx=xf−xi
dy=yf−yi
```

```
xvmax=dx/tmin-(xvi+xvf)/2
IF xvmax>vmax
    xvmax=vmax
ENDIF
IF xvmax<-vmax
    xvmax=-vmax
ENDIF REMARK    Assumes that dt1 = dt3. If dt1 and dt3 = tmin, maximum
velocity is employed.

yvmax=dy/tmin-(yvi+yvf)/2
IF yvmax>vmax
    yvmax=vmax
ENDIF
IF yvmax<-vmax
    yvmax=-vmax
ENDIF REMARK    Calculate dt for segments 1 and 3, assuming three seg-
ments are required to execute this particular positioning command.

kpo2=(PI/2)/amax
dt1=MAX(tmin,ABS((xvmax-xvi)*kpo2),ABS((yvmax-yvi)*kpo2))
dt3=MAX(tmin,ABS((xvf-xvmax)*kpo2),ABS((yvf-yvmax)*kpo2))

REMARK    Calculate dt2 for both the x and y axis (xdt2 and ydt2). If
either result is positive, a constant velocity segment 2 is required. xdt2
and
ydt2 also determine a dominant axis i.e., the axis that requires the most
time to move at constant maximum velocity.

IF xvmax>0
    xdt2=(dx-((xvi+vmax)*dt1/2)-((xvf+vmax)*dt3/2))/vmax
ELSE
    xdt2=(dx-((xvi-vmax)*dt1/2)-((xvf-vmax)*dt3/2))/-vmax
ENDIF
IF yvmax>0
    ydt2=(dy-((yvi+vmax)*dt1/2)-((yvf+vmax)*dt3/2))/vmax
ELSE
    ydt2=(dy-((yvi-vmax)*dt1/2)-((yvf-vmax)*dt3/2))/-vmax
ENDIF IF xdt2>0 OR ydt2>0   !three segment movement
REMARK    Calculate dp,dv for each movement segment
    IF xdt2>ydt2      !X axis Primary
        dx1=(xvi+xvmax)*dt1/2
        xdv1=xvmax-xvi
        dx2=((-xvi-xvmax)*dt1/2)+((-xvmax-xvf)*dt3/2)+dx
        xdt2=0
        dx3=(xvmax+xvf)*dt3/2
        xdv3=xvf-xvmax
        ydt2=xdt2
        kb=1/(2*ydt2+dt3+dt1)
        dy1=((yvi-yvf)*((dt1*dt3)/2+(dy+yvi*ydt2)*dt1)*kb
        ydv1=((-yvi-yvf)*dt3+2*dy-2*yvi*(ydt2+dt1))*kb
        dy2=(2*dy-dt1*yvi-dt2*yvf)*ydt2*kb
        ydv2=0
        dy3=((yvf-yvi)*((dt3*dt1)/2+(dy+ydt2*yvf)*dt3)*kb
        ydv3=((yvi-yvf)*dt1-2*dy+2*(dt3+ydt2)*yvf)*kb
    ELSE              !Y primary axis
        dy1=(yvi+yvmax)*dt1/2
        ydv1=yvmax-xvi
        dy2=((-yvi-yvmax)*dt1/2)+((-yvmax-yvf)*dt3/2)+dy
        ydt2=0
        dy3=(yvmax+yvf)*dt3/2
        ydv3=yvf-yvmax
        xdt2=ydt2
        kb=1/(2*xdt2+dt3+dt1)
        dx1=(xvi-xvf)*((dt1*dt3)/2+(dx+xvi*xdt2)*dt1)*kb
        xdv1=((-xvi-xvf)*dt3+2*dx-2*xvi*(xdt2+dt1))*kb
        dx2=(2*dx-dt1*xvi-dt3*xvf)*xdt2*kb
        xdv2=0
        dx3=((xvf-xvi)*((dt3*dt1)/2+(dx+xdt2*xvf)*dt3)*kb
        xdv3=((xvi-xvf)*dt1-2*dx+2*(dt3+xdt2)*xvf)*kb
    ENDIF
ELSE !two segment movement
REMARK    Calculate dtx and dty to determine dt for segments 1 and 3.
    twomovetime (xvi,xvf,xi,xf,xdt)
    twomovetime (yvi,yvf,yi,yf,ydt)

REMARK    For two segment movement, dt1 = dt3 = the larger of dtx
or dty.

dt1=MAX(xdt,ydt)
    dt3=dt1

REMARK    Calculate dp and dv for segments 1 and 3.
    twosegmentmove
    xdt2=0
    ydt2=0
    dx2=0
    dt2=0
    xdv2=0
    ydv2=0
ENDIF

RETURN

REMARK    End of procedure gen_move

PROCEDURE twosegmentmove
    dx1=dx/2+xvi*dt1/4-xvf*dt1/4
    xdv1=dx/dt1-3*xvi/2-xvf/2 dy1=dy/2+yvi*dt1/4-yvf*dt1/4
    ydv1=dy/dt1-3*yvi/2-yvf/2 dx3=dx/2-xvi*dt3/4+xvf*dt3/4
    xdv3=-dx/dt3+xvi/2+3*xvf/2 dy3=dy/2-yvi*dt3/4+yvf*dt3/4
    ydv3=-dy/dt3+yvi/2+3*yvf/2

RETURN

PROCEDURE twomovetime(vi,vf,ip,fp,VAR dt)
    LOCAL k1,k2,k3
    dt=tmin
    k1=3*vi+vf
    kls=k1^2
    k2=(32/PI)*amax*(fp-ip)
    k3=PI/(8*amax)
    IF kls+k2>0
        dt=MAX(dt,k3*(-k1+SQR(kls-k2)))
    ENDIF
    IF kls-k2>0
        dt=MAX(dt,k3*(k1+SQR(kls-k2)))
    ENDIF
    k1=vi+3*vf
    kls=k1^2
    IF kls+k2>0
        dt=MAX(dt,k3*(-k1+SQR(kls+k2)))
    ENDIF
    IF kls-k2>0
        dt=MAX(dt,k3*(k1+SQR(kls-k2)))
    ENDIF
RETURN
```

Referring again to FIG. 2, the dx, dy, dv, and dt components generated by delta process 70 are further processed by position profiler 72 into the half-sine positioning signal required to move fast stage 54 and slow stages 56 and 58 as commanded by the database. Ideally, positioner acceleration is proportional to motive force, and motive force is proportional to electrical current supplied to a positioner driver such as a linear or rotary servo motor or a galvanometer coil. Therefore, the positioning signal produced by position profiler 72 is a series of "full-spectrum" half-sine profiled acceleration-inducing positioning steps that cause movements such as those shown in FIGS. 3A and 3B. The full-spectrum bandwidth need only be about 250 Hertz, a bandwidth sufficient to drive a typical galvanometer-driven mirror positioner at its maximum frequency.

Instantaneous values of the full-spectrum positioning signal are generated by DSP 52 at a rate of about 10,000 points per second by employing the dx, dy, dv, and dt components generated by delta process 70 as variables for a sine value generation program running in DSP 52. Alternatively, the dx, dy, dv, and dt components may be employed to address and fetch associated sinusoidal waveform values stored in a sine value lookup table that is incorporated within DSP 52.

The resulting full-spectrum positioning signal has acceleration and position components that are received by a profiling filter 78 having a constant signal propagation delay and a delay element 79 that compensates in DSP 52 for the constant signal propagation delay of profiling filter 78. For example, delay element 79 delays the laser triggering pulses generated by position profiler 72 to coincide with the delayed movements of fast stage 54 and slow stages 56 and 58. Profiling filter 78 and delay element 79 also cooperate, as described below, to move slow stages 56 and 58 smoothly over the average position profile while limiting its acceleration to ±1 g and cooperate to limit fast stage 54 positioning movements to ±10 millimeters.

The position component is received by profiling filter 78 to produce filtered position command data for driving slow stages 56 and 58. Profiling filter 78 is preferably a fourth-order low-pass filter represented below by Eq. 1.

$$G(s) = \left[ \frac{1}{\left(\frac{s}{\omega}\right)^2 + \frac{2\zeta s}{\omega} + 1} \right]^2 \quad (1)$$

In Eq. 1, $\omega$ is the natural, or cutoff, frequency of profiling filter 78 and $\zeta$ is its damping ratio. Preferably, $\omega$ equals 38 radians per second and $\zeta$ equals 0.707. The 0.707 value of $\zeta$ is referred to as the critical damping ratio because it produces a phase lag that is linear with frequency up to the cutoff frequency $\omega$ of profiling filter 78. The linear phase lag results in a constant time delay for any half-sine positioning signal having a frequency content up to the natural frequency. For the Eq. 1 filter, the time delay equals $4\zeta/\omega$ seconds.

Because profiling filter 78 produces filtered position command data having a constant time delay with respect to the half-sine positioning signal position component, the constant time delay is compensated for by delay element 79. Delay element 79 is preferably implemented in DSP 52 as a programmed delay in conveying the half-sine positioning signal acceleration and position components from position profiler 72 to fast stage 54 signal processing elements, the first of which are adders 80 and 82. Thereby, half-sine positioning signals directed to fast stage 54 are time synchronized with the filtered position commands directed to slow stages 56 and 58.

The acceleration component from position profiler 72 is also filtered by profiling filter 78 to provide a filtered acceleration command to adder 80 and a feed forward process 94. Adder 80 functions as a high-pass filter by subtracting the filtered acceleration command from the acceleration component of the full-spectrum positioning signal to form a galvo acceleration feed forward signal, which is conveyed to a feed forward process 86. Likewise, the filtered position command from profiling filter 78 and the delayed position component of the half-sine positioning signal are conveyed respectively to adders 90 and 82 for processing and distribution, respectively, to slow stages 56 and 58 and fast stage 54. A galvo filter 97 and a servo filter 98 are conventional loop compensation filters that function to keep fast stage 54 and slow stages 56 and 58 stable.

Profiling filter 78 is implemented by cascading two or more second-order filters having critical damping ratios. As the number of cascaded filters increases beyond two, their cutoff frequencies increase by about the square root of the number of filters (e.g., two filters have cutoffs that are 1.414 times the cutoff for a single filter). Preferably two filters are cascaded to provide good smoothing while keeping the overall filter implementation simple.

The profiling filter response represented by Eq. 1 can be expressed as a discrete equivalent through a bilinear transformation. The resulting digital transfer function is represented below by Eq. 2.

$$Gz(z) = \frac{k(z^2 + 2z + 1)^2}{(z^2 + b_1 z + b_2)^2} \quad (2)$$

The time-domain equations for filter outputs $y_k$ and $w_k$, given prior inputs and outputs, are represented below by Eqs. 3 and 4.

$$y_k = w_k + 2w_{k-1} + w_{k-2} - b_1 y_{k-1} - b_2 y_{k-2} \quad (3)$$

$$w_k = k(V_k + 2V_{k-1} + V_{k-2}) - b_1 w_{k-1} - b_2 w_{k-2} \quad (4)$$

The coefficients in Eqs. 3 and 4 are determined as represented below in Eq. 5.

$$\begin{bmatrix} k \\ b_1 \\ b_2 \end{bmatrix} = \begin{bmatrix} \left( \frac{\omega^2 T^2}{4 + 4\zeta T\omega + T^2\omega^2} \right)^2 \\ \frac{-8 + 2T^2\omega^2}{4 + 4\zeta T\omega + T^2\omega^2} \\ \frac{-4\zeta T\omega + 4 + T^2\omega^2}{4 + 4\zeta T\omega + T^2\omega^2} \end{bmatrix} \quad (5)$$

In Eq. 5, T is the sample period of the filter, $\omega$ is its cutoff frequency, and $\zeta$ is its damping ratio.

For profiling filter 78, the preferred 38 radian per second cutoff frequency (about 6 Hertz) is a very low frequency compared to the 10 kiloHertz rate at which DSP 52 updates positioning data for slow stages 56 and 58. If profiling filter 78 runs at the 10 kiloHertz slow stage update frequency, the discrete filter coefficients become sensitive to roundoff errors because the poles of the discrete filter move close to the unit circle. Therefore, it is preferred that profiling filter 78 run as two second-order filters as represented in Eqs. 3 and 4 to reduce the order of the filter equation and to keep the filter coefficients reasonably controlled. Profiling filter 78 also receives the acceleration command from position profiler 72 and generates the filtered acceleration command that is conveyed to servo feed forward process 94 and to adder 80.

The desired move profile commands are preferably calculated at the 10 kiloHertz updating rate, and the slow stage acceleration and actual (not commanded) position is subtracted therefrom at adders 80 and 82 to produce, respectively, the fast stage acceleration and position command signals.

The fast stage acceleration command signal is processed through adder 80 and feed forward process 86, while the fast stage position command signal is processed through adder 82 and galvo filter 97. The processed fast stage signals are combined in an adder 84 and conveyed to a galvanometer driver 88.

Likewise, the slow stage filtered acceleration command is processed through a feed forward process 94, while the slow stage filtered position command is processed through adder 90 and servo filter 98. The processed slow stage signals are combined in an adder 92 and conveyed to a linear servo motor driver 96.

Galvanometer driver 88 provides deflection control current to a pair of mirror deflecting galvanometers in fast stage 54, and servo motor driver 96 provides control current to linear servo motors that control the positioning of slow stages 56 and 58.

Figure 4:
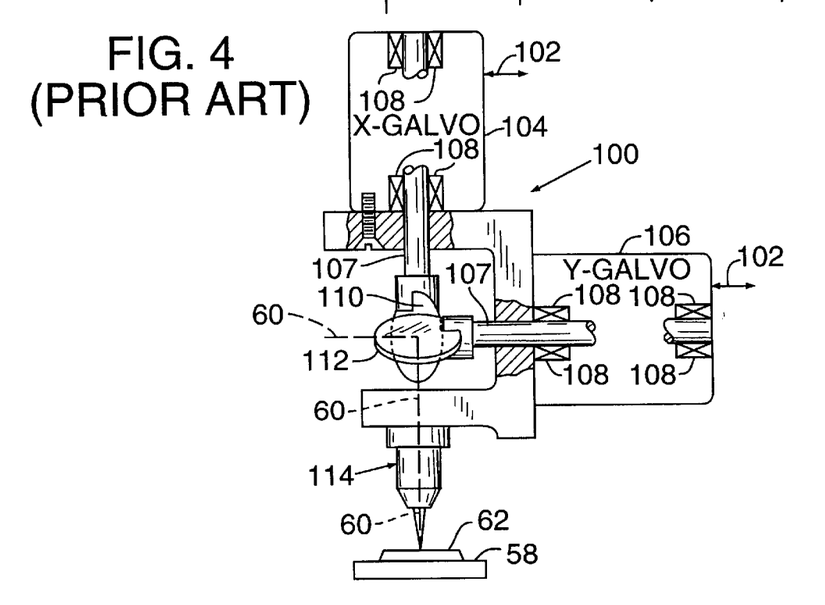
FIG. 4 is a fragmentary pictorial side view showing a prior art galvanometer-driven mirror positioner of a type suitable for use with this invention.

FIG. 4 shows a prior art galvanometer-driven mirror positioner 100 of a type suitable for use as fast stage 54. Galvanometer driver 88 (FIG. 2) provides rotational control current on conductors 102 to respective X-axis and Y-axis high-speed response D.C. motors 104 and 106 that rotate shafts 107 in bearings 108 to selectively pivot a pair of mirrors 110 and 112 that deflect laser beam 60 through an optional lens 114 to a predetermined target location on workpiece 62.

Alternatively, a nonbearing motion positioner, such as a piezoelectric element, a voice coil actuator, or other limited angle high-speed positioner device could be used in place of galvanometer-driven mirror positioner 100 in positioner system 50.

Likewise with reference to FIG. 2, alternative accurate rotary or linear positioner mechanisms may be substituted for the linear servo motors driving slow stages 56 and 58. However, in positioner system 50, linear motors that preferentially respond to the slow stage position command are preferred.

Two signals are combined with the slow and fast stage position commands to reduce positional errors between the commanded position and the actual position of laser beam 60 on workpiece 62. The delayed fast stage position command at adder 82 and the filtered slow stage position command at adder 90 represent the ideal signal values required to cause proper positioning of stages 54, 56, and 58. However, practical factors such as gravity, friction, mass, and inaccuracies in the full-spectrum positioning signal generated by position profiler 72 are not contemplated in the unmodified position commands.

The practical factors are accounted for by sensing the actual positions of stages 54, 56, and 58 with position sensors 120 and 122 to provide predictive position feedback data to adders 82 and 90 in DSP 52. Note that adder 82 in the fast stage positioning path receives position feedback data from both position sensors 120 and 122. Position sensors 120 and 122 may be well-known types employing rotating capacitor plates, linear and rotary encoder scales, or interferometer motion detectors together with appropriate analog-to-digital and/or digital-to-analog conversion techniques.

As laser beam 60 undergoes movement across workpiece 62, the sensed beam position is continuously compared to the commanded beam position, with the positional difference representing a degree to which the practical factors have caused positioning errors. In particular, sensed position data of fast stage 54 and slow stages 56 and 58 are generated by position sensors 120 and 122 and subtracted from the commanded position at adder 82 to generate positional difference data that are combined in adder 84 with acceleration data from feed forward process 86. Likewise, sensed position data of slow stages 56 and 58 are generated by position sensor 122 and subtracted from the commanded position at adder 90 to generate positional difference data that are combined in adder 92 with acceleration data from feed forward process 94.

Figure 5:
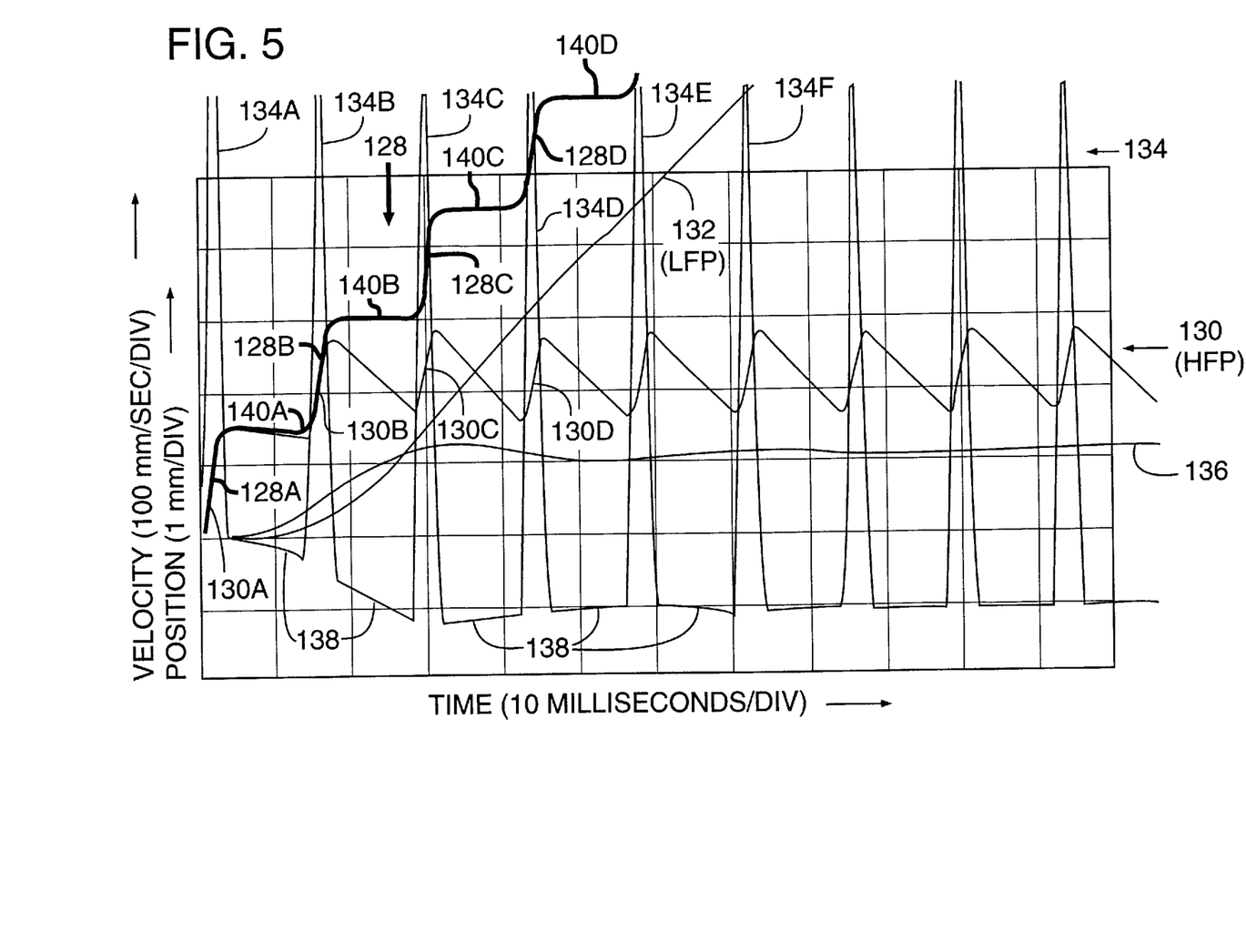
FIG. 5 is a waveform graph representing fast and slow positioner stage velocities and positions responsive to positioning signals according to this invention.

FIG. 5 graphically shows how fast stage 54 and slow stages 56 and 58 coordinate their movements in response to a representative full-spectrum positioning signal 128 (shown in bold lines), which is divided in DSP 52 (FIG. 2) into a high-frequency position ("HFP") signal portion 130 and a low-frequency position ("LFP") signal portion 132. HFP signal portion 130 represents the AC-coupled, 25–250 Hertz high-passband portion of full-spectrum positioning signal 128, and LFP signal portion 132 represents the direct-coupled, 0–25 Hertz low-passband portion of full-spectrum positioning signal 130.

Each half-sine profiled positioning step in full-spectrum positioning signal 128 (uniquely identified by a letter suffix, e.g., 128A, 128B, 128C, and 128D) causes a correspondingly identified step in HFP signal portion 130 (e.g., 130A, 130B, 130C, and 130D). In this example, each positioning step is separated from adjacent positioning steps by about 10 milliseconds, but the time separation, if any, is a function of timing data in the tool path database.

FIG. 5 further shows a resultant fast stage velocity waveform 134 and a resultant slow stage velocity waveform 136 that reveal, respectively, how fast stage 54 and slow stages 56 and 58 respond to HFP signal portion 130 and LFP signal portion 132.

In particular, HFP signal portions 130A, 130B, 130C, and 130D each include acceleration segments that cause fast stage 54 to undergo sine-profiled velocity changes as represented by corresponding fast velocity waveform pulses 134A, 134B, 134C, and 134D. Fast velocity waveform 134 has a baseline 138 that transitions in a negative velocity direction and settles at a value of about −100 millimeters per second. This baseline shift is caused by combining in adder 80 the delayed and filtered acceleration commands.

HFP signal portion 130 also represents how fast stage 54 responds positionally to each of fast velocity pulses 134. The peak fast stage positioning displacement required in this example is about 2.8 millimeters, which is well within the 10-millimeter linear range of a low-mass, galvanometer-driven mirror positioner.

LFP signal portion 132 also represents how slow stages 56 and 58 respond positionally to slow velocity waveform 136. Slow stage velocity waveform 136 transitions in a positive velocity direction and settles at a value of about +100 millimeters per second. In this example, the slow stage position changes linearly with time such that at least one of slow stages 56 and 58 does not stop moving.

Full-spectrum positioning signal 128 also represents the net positions resulting from the combined fast and slow stage positions represented respectively by waveforms 132 and 130. Plateaus 140A, 140B, 140C, and 140D indicate 10 millisecond time periods during which the coordinated position is stationary even though stages 54, 56, and 58 may all be moving. This is clearly shown for plateau 140C, directly under which waveforms 130 and 132 intersect with substantially equal and opposite slopes. Plateaus 140 correspond to time periods during which laser 76 may be triggered to process holes in workpiece 62.

The above-described coordinated positioning is particularly beneficial for applications such as laser beam hole cutting that requires rapid movement between target locations along a tool path combined with pauses at each target location to fire the laser to cut a hole but, of course, is not limited to that application.

Figure 6:
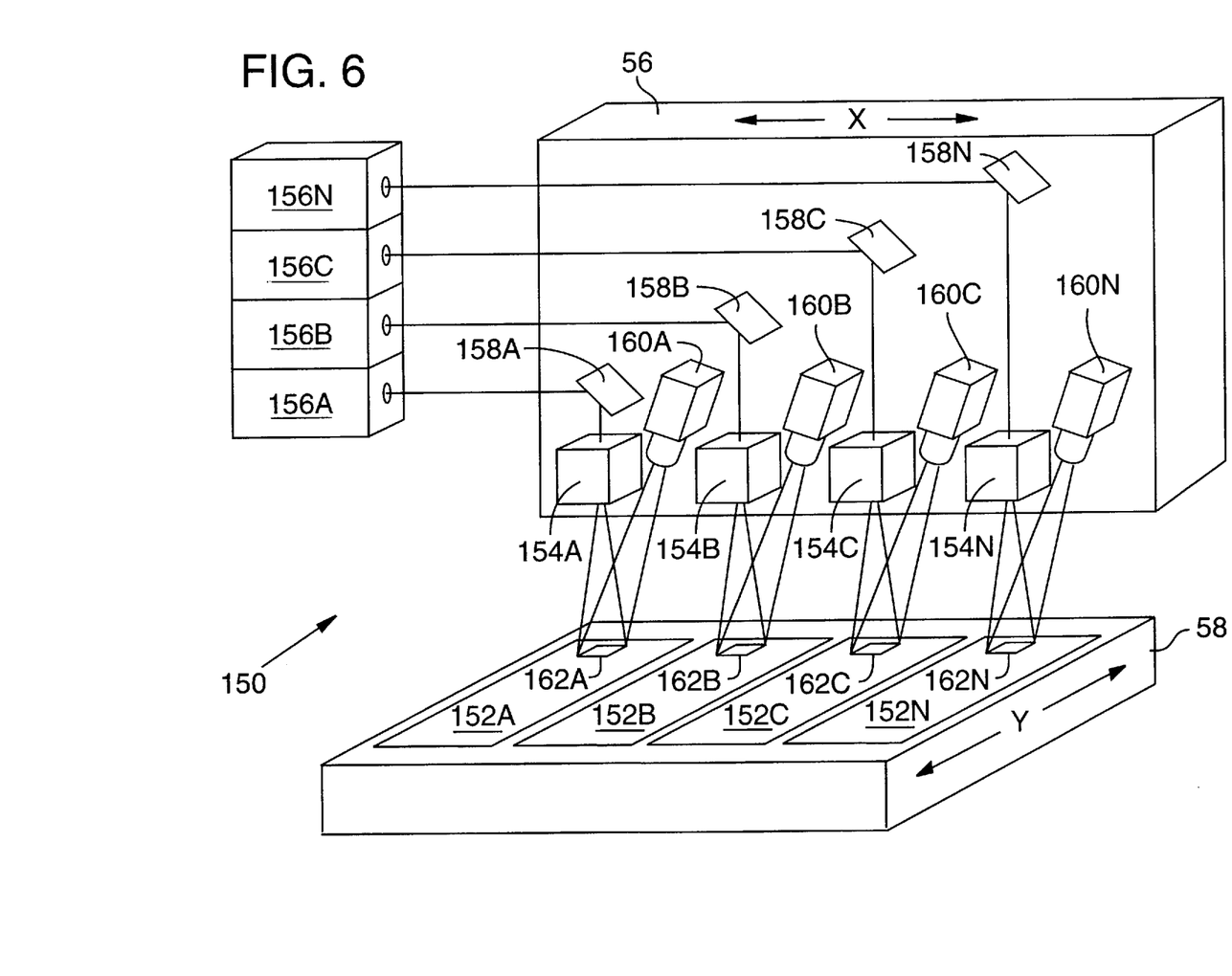
FIG. 6 is an oblique pictorial view showing a multi-head laser machining system of this invention.

FIG. 6 shows a multi-head positioner 150 embodiment of this invention in which multiple workpieces 152A, 152B, 152C, . . . 152N are simultaneously processed. (Hereafter multiple elements are referred to collectively without the letter suffix, e.g., "workpieces 152"). Multi-head positioner 150 employs one each of slow stages 56 and 58 configured such that workpieces 152 are fixtured and carried on Y-axis slow stage 58 and multiple fast stages 154A, 154B, 154C, . . . 154N are carried on X-axis slow stage 58. Of course, the roles of slow stages 56 and 58 may be reversed.

As the number of fast stages 154 carried on slow stage 58 increases, their accumulated mass becomes increasingly difficult to accelerate. Therefore, the number N of fast stages 154 carried on slow stage 58 is preferably limited to four, although N may vary with positioner types and applications.

Each of workpieces 152 has associated with it a processing tool, preferably a laser 156A, 156B, 156C, . . . 156N that directs processing energy toward associated fast stages 154A, 154B, 154C, . . . 154N by way of associated mirrors 158A, 158B, 158C, . . . 158N. Fast stages 154 deflect the processing energy to target locations in substantially square, 20 by 20 millimeter processing fields 162A, 162B, 162C, . . . 162N located on associated workpieces 152.

Video cameras 160A, 160B, 160C, . . . 160N are positioned on slow stage 56 for viewing associated processing fields 162, sensing the alignments, offsets, rotations, and dimensional variations of workpieces 152, and aiming and focusing lasers 156.

In the preferred embodiment, the same processing pattern is duplicated on workpieces 152 by each of lasers 156 and fast stages 154. However, in some processing applications, processing pattern variations may be required to match the pattern to variations among workpiece geometries, scale factors, offsets, rotations, distortions. It may also be necessary to correct for fast stage nonlinearities and "abbe errors" (the degree to which a commanded tool position does not match a sensed target location) introduced by mounting position variations among workpieces 152 mounted on slow stage 58. Unlike prior multi-spindle drilling machines, multi-head positioner 150 can compensate for the above-described variations by employing programmable correction factors, described with reference to FIGS. 7 and 8, when driving each of fast stages 154.

Figure 7:
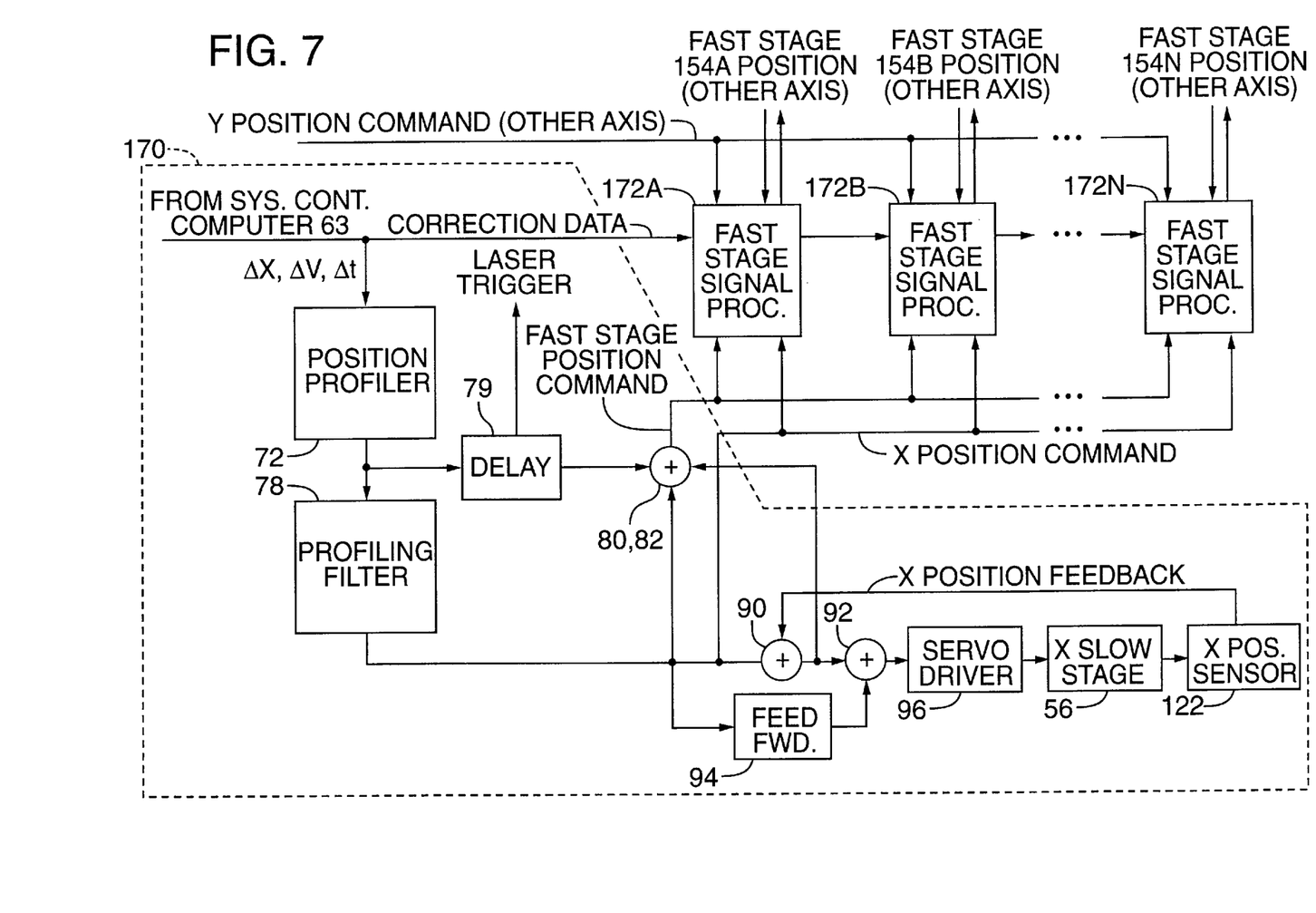
FIG. 7 is a simplified electrical block diagram of a digital signal processing system including multiple fast stage signal processors employed in the multi-head laser machining system of FIG. 6.

FIG. 7 shows how multi-rate positioner DSP 52 (FIG. 2) may be adapted to coordinate the positioning of multiple fast stages 154 and slow stages 56 and 58, resulting in a multi-head DSP 170. In like manner to DSP 52, multi-head DSP 170 receives from system control computer 63 dx, dy, dv, and dt components that are further processed by position profiler 72 into half-sine profiled positioning signals. DSP 170 also includes some of the same signal processing elements as DSP 52, namely profiling filter 78, delay element 79, feed forward process 94, servo driver 96, slow stage 56, and position sensor 122. Because FIG. 7 is simplified, only X-axis slow stage 56 processing elements are shown. Skilled workers will understand that corresponding Y-axis elements are implied.

Only a single system control computer 63 is required to drive slow stages 56 and 58 and N fast stages 154. Multiple fast stage signal processors 172A, 172B, 172C, . . . 172N each receive fast stage correction data from system control computer 63. In this way, fast stage position commands and current slow stage position data are received by each of fast stage signal processors 172 such that each of fast stages 154 is directed to a common set of target locations that are further positionable by unique error correction data.

Figure 8:
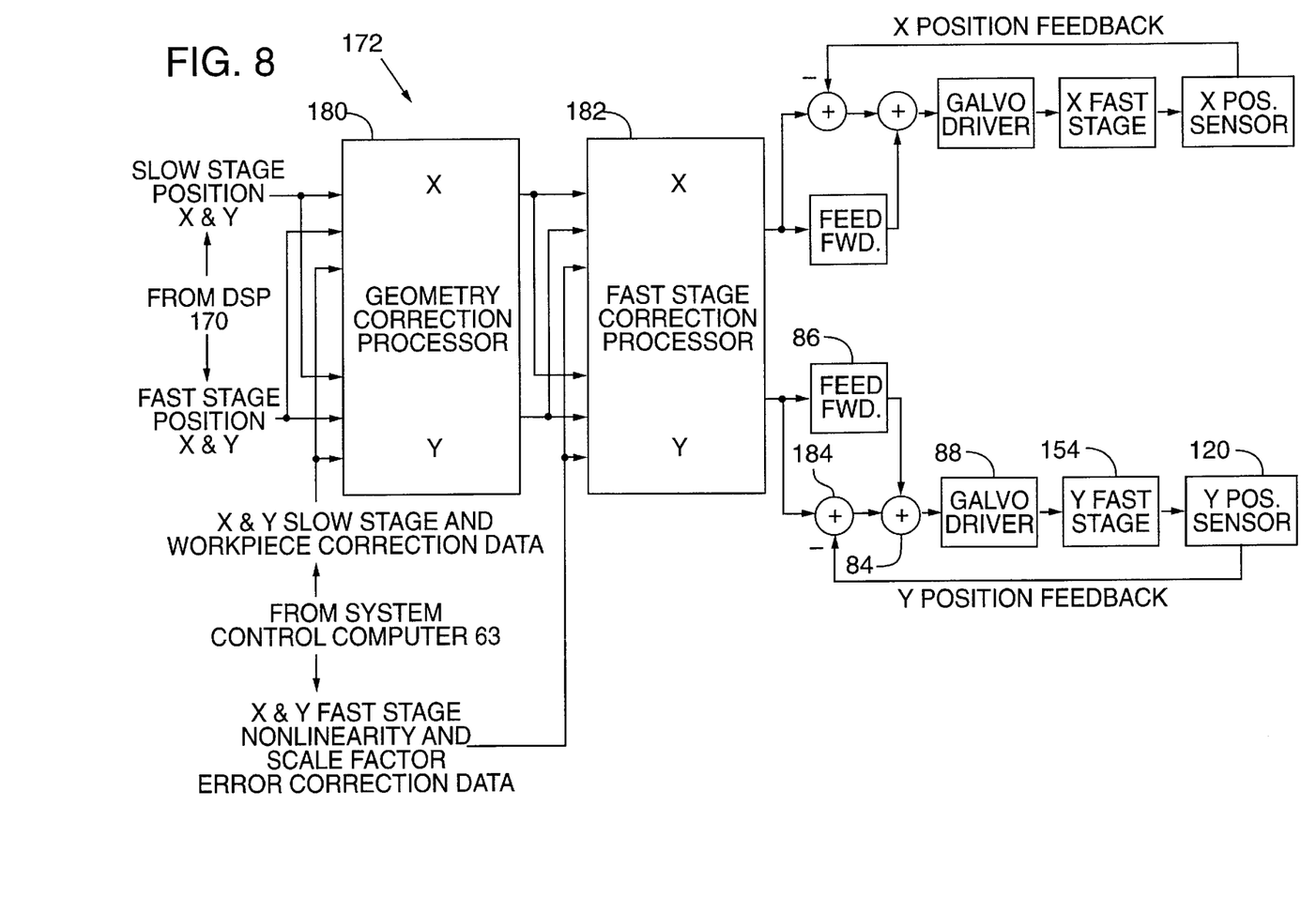
FIG. 8 is a simplified electrical block diagram of one of multiple fast stage signal processors employed in the digital signal processing system of FIG. 7.

FIG. 8 shows a representative one of fast stage signal processors 172 receiving fast and slow stage positioning data from DSP 170 and correction data from system control computer 63. The correction data include slow stage and workpiece related correction data that are conveyed to a geometry correction processor 180 and fast stage linearity and scale factor correction data that are conveyed to a fast stage correction processor 182.

The correction data may be equation- or lookup table-based. However, correction data employed by geometry correction processor 180 and fast stage correction processor are preferably equation-based along lines described in U.S. Pat. No. 4,941,082 for LIGHT BEAM POSITIONING SYSTEM ("the U.S. Pat. No. '082"), which is assigned to the assignee of this application and is incorporated herein by reference.

Fast stage linearity and scale factor errors are relatively constant and depend mostly on the individual characteristics of fast stages 154. Therefore, fast stage correction processor 182 requires relatively small and infrequent correction data changes. Generating this correction data entails, for example, directing each of fast stages 154 to at least 13 calibration points on an associated calibration target as described in the U.S. Pat. No. '082. A reflected energy detector senses any differences between the directed and actual target point locations and provides difference data to system control computer 63 for processing. The resulting correction data are conveyed to and stored in each fast stage correction processor 182. Also, any differences between the directed and actual target point locations sensed by associated video cameras 160 are calibrated and compensated for. Slow stage linearity and scale factor errors are also relatively constant and do not, therefore, require frequent correction data changes.

On the other hand, slow stage and workpiece related errors are relatively variable and depend mostly on workpiece placement, offset, rotation, and dimensional variations among workpieces 152. Therefore, geometry correction processor 180 requires relatively large correction data changes every time workpieces 152 are changed. Generating this correction data entails, for example, directing slow stages 56 and 58 and each of fast stages 154 to at least two, and preferably four, predetermined calibration targets on each associated workpiece 152. These calibration targets may be, for example, corners, tooling holes, or photoetch targets of an ECB. Each video camera 160 senses differences between the directed and actual calibration target locations and provides difference data to system control computer 63 for processing. The resulting correction data for each workpiece 152 are conveyed to and stored in the associated geometry correction processor 180.

For each fast stage signal processor 172, corrected positioning data for the Y-axis are conveyed from correction processors 180 and 182 to feed forward process 86, galvo driver 88, and fast stage 154. Position feedback data are generated by position sensor 120 (as in FIG. 2) and combined for correction in adders 184 and 84. Skilled workers will understand that the same process applies to X-axis fast positioning.

In applying the correction data to fast stages 154, each fast stage is preferably limited to an 18 by 18 millimeter positioning range within its 20 by 20 millimeter maximum linear positioning range. The remaining 2 millimeters of positioning range is employed for applying the above-described corrections.

The foregoing describes signal processing for a single axis of motion for each of the fast and slow positioner stages. Skilled workers will readily understand how to replicate the signal processing to coordinate the motion of both axes, both stages, and single or multiple fast positioners.

EXAMPLE

A typical application of this invention is laser cutting of holes, such as blind via holes, in multilayer ECBs. Multilayer ECBs are typically manufactured by registering, stacking together, laminating, and pressing multiple 0.05- to 0.08-millimeter thick circuit board layers. Each layer typically contains a different interconnection pad and conductor pattern, which after processing constitutes a complex electrical component mounting and interconnection assembly. The component and conductor density trend of ECBs is increasing together with that of integrated circuits. Therefore, the positioning accuracy and dimensional tolerances of holes in ECBs is increasing proportionally.

Unfortunately, the pressing step causes expansion and dimensional variations that lead to scale factor and orthogonality variations among the ECBs. Moreover, when multiple ECBs (workpieces 152) are attached to slow stage 58, fixturing variations can cause dimensional rotation and offset errors among the ECBs. Adding to that, ECB thickness variations make it difficult to mechanically drill holes having an accurately predetermined depth.

This invention solves the above-described problems as follows. Two to four calibration targets are etched at predetermined locations, preferably one at each corner, on each ECB. Video cameras 160 sense differences between the commanded and actual calibration target locations and provide difference data to system control computer 63 for processing. The resulting correction data are conveyed to and stored in geometry correction processor 180.

Two calibration targets provide sufficient difference data to system control computer 63 to correct for rotation and offset variations among the ECBs. Three calibration targets provide sufficient difference data to system control computer 63 to correct for rotation, offset, scale factor, and orthogonality variations among the ECBs. Adding a fourth calibration target further allows for correction of trapezoidal distortion in each of the ECBs.

ECB thickness variations are readily accommodated by the ±0.13-millimeter (±0.005 inch) laser depth of field.

Processing blind via holes presents a difficult challenge for any hole processing tool because of the tight depth, diameter, and positioning tolerances involved. This is because blind via holes are typically processed through a first conductor layer (e.g., copper, aluminum, gold, nickel, silver, palladium, tin, and lead), through one or more dielectric layers (e.g., polyimide, FR-4 resin, benzocyclobutene, bismaleimide triazine, cyanate ester-based resin, ceramic), and up to, but not through a second conductor layer. The resulting hole is plated with a conductive material to electrically connect the first and second conductor layers.

Referring again to FIG. 6, multi-head positioner 150 is configured as an ECB blind via cutting apparatus in which N equals an even number, such as 2, 4, or 6, but preferably 4. Lasers 156A and 156C are UV lasers (wavelength is less than about 355 nanometers), and lasers 156B and 156N are IR lasers (wavelength is in a range from about 1,000 nanometers to about 10,000 nanometers, preferably 9,000 nanometers). Because the UV and IR lasers have substantially different wavelengths, mirrors 158 and optics for fast stages 154 are configured for compatibility with each associated laser's wavelength.

UV lasers 156A and 156C are capable of cutting both the first conductor layer and the dielectric layer in a suitable manner. However, the laser power levels and pulse repetition rates must be carefully controlled to prevent unacceptable damage to the second conductor layer. This results in a narrow "process window." Therefore, UV lasers 156A and 156C are controlled to cut through only the first conductor layer and a portion of the dielectric layer, a process that has a wide process window.

IR lasers 156B and 156N have a wide process window for cutting through the remaining dielectric layer without cutting through or damaging the second conductor layer. However, the first conductor layer must be previously processed.

The ECB blind via cutting apparatus employs UV lasers 156A and 156C to cut through the first conductor layers of workpieces 152A and 152C and IR lasers 156B and 156N to cut through the dielectric layers on workpieces 152B and 152N.

Using multi-head positioner 150 to cut blind via holes proceeds according to the following preferred process. Assume, for example, that an eight workpiece batch of ECBs (ECB1, ECB2, . . . and ECB8) is processed. Preferably, the conductor layers are copper and the dielectric layer is FR-4 resin.

Mount unprocessed ECB1 and ECB2 on slow stage 58 in workpiece positions 152A and 152C for processing by respective UV lasers 156A and 156C.

Perform a workpiece calibration process as follows:

direct slow stages 56 and 58 and fast stages 154 to calibration target locations on the ECBs;

sense with video cameras 160 differences between the directed and actual target locations and provide difference data to system control computer 63 for processing; and store correction data for the ECBs in associated fast stage signal processors 172.

Position slow stages 56 and 58 and fast stages 154 to a predetermined set of target locations such that UV lasers 156A and 156C cut through the first conductor layers on ECB1 and ECB2 at the set of target locations.

Remount semiprocessed ECB1 and ECB2 on slow stage 58 in workpiece positions 152B and 152N for processing by respective IR lasers 156B and 156N.

Mount unprocessed ECB3 and ECB4 on slow stage 58 in workpiece positions 152A and 152C for processing by respective UV lasers 156A and 156C.

Perform the workpiece calibration process.

Position slow stages 56 and 58 and fast stages 154 such that UV lasers 156A and 156C cut through the first conductor layers at the target locations on ECB3 and ECB4 while IR lasers 156B and 156D concurrently cut through the dielectric layers at the target locations on ECB1 and ECB2.

Unmount processed ECB1 and ECB2 from slow stage 58.

Remount semiprocessed ECB3 and ECB4 on slow stage 58 in workpiece positions 152B and 152N for processing by respective IR lasers 156B and 156N.

Mount unprocessed ECB5 and ECB6 on slow stage 58 in workpiece positions 152A and 152C for processing by respective UV lasers 156A and 156C.

Perform the workpiece calibration process.

Position slow stages 56 and 58 and fast stages 154 such that UV lasers 156A and 156C cut through the first conductor layers at the target locations on ECB5 and ECB6 while IR lasers 156B and 156D concurrently cut through the dielectric layers at the target locations on ECB3 and ECB4.

Unmount processed ECB3 and ECB4 from slow stage 58.

Remount semiprocessed ECB5 and ECB6 on slow stage 58 in workpiece positions 152B and 152N for processing by respective IR lasers 156B and 156N.

Mount unprocessed ECB7 and ECB8 on slow stage 58 in workpiece positions 152A and 152C for processing by respective UV lasers 156A and 156C.

Perform the workpiece calibration process.

Position slow stages 56 and 58 and fast stages 154 such that UV lasers 156A and 156C cut through the first conductor layers at the target locations on ECB7 and ECB8 while IR lasers 156B and 156D concurrently cut through the dielectric layers at the target locations on ECB5 and ECB6.

Unmount processed ECB5 and ECB6 from slow stage 58.

Remount semiprocessed ECB7 and ECB8 on slow stage 58 in workpiece positions 152B and 152N for processing by respective IR lasers 156B and 156N.

Perform the workpiece calibration process.

Position slow stages 56 and 58 and fast stages 154 such that IR lasers 156B and 156D cut through the dielectric layers at the target locations on ECB8 and ECB8.

Unmount processed ECB7 and ECB8 from slow stage 58.

The process for cutting blind via holes in eight workpieces is completed. Of course, the process may be adapted to concurrently process various numbers of workpieces, and the batch size is not limited to eight, nor to ECBs.

The time required for UV lasers 156A and 156C to cut through the conductor layers is typically longer than the time required by IR lasers 152B and 152N to cut through the dielectric layer. Therefore, the longer processing time dictates the processing throughput. Because the target locations are substantially identical for all tools on multi-tool positioner 150, the different processing times are accounted for by providing appropriately different laser power levels and pulse repetition rates for the UV and IR lasers.

Some applications require cutting relatively large hole diameters of about 200 micrometers or less. Because UV lasers 154A and 154C have a beam diameter of only about 20 micrometers, multi-tool positioner 150 must cause the UV beam to follow a spiral or circular path to cut such holes in a conductor layer. Therefore, cutting these relatively large holes takes a proportionally longer time. However, IR lasers 154B and 154N have a beam diameter of about 400 micrometers, which is about 20 times the UV laser beam diameter. Therefore, when cutting these relatively large diameter holes through the dielectric layers, at least some portion of the IR laser beam will cover the entire hole while the UV beam follows the spiral or circular path to cut a hole in a conductor layer. Under these circumstances, the IR laser beams are on the target locations for a relatively longer time and the different effective processing times are again accounted for by providing appropriately different laser power levels and pulse repetition rates for the UV and IR lasers.

If suitable laser power is available, a single laser may be shared among multiple workpieces by employing suitable power splitting devices. It is also envisioned that switchable-wavelength lasers may be employed in this invention.

This invention provides an improved combination of positioning accuracy, positioning speed, minimized or eliminated stopping time, nonpanelized tool path databases, and minimized fast stage movement range that dramatically improves processing throughput while reducing workpiece rejects caused by dimensional and orientation variations.

Skilled workers will recognize that portions of this invention may be implemented differently from the laser beam micro-machining implementation described above. For example, a wide variety of tools, in single or multi-headed configurations, may be moved by the fast positioner stage, such as micro-dimensioned drills, punches, lasers, laser beams, radiation beams, particle beams, beam producing devices, microscopes, lenses, optical instruments, and cameras. Also, many different positioning devices may be employed in different combinations drawn from among galvanometers, voice coils, piezoelectric transducers, stepper motors, and lead screw positioners. The DSPs need not be completely digital and may, for example, include any suitable combination of analog and digital subcircuits. Of course, the positioning signal profiles, spectral bandwidth and amplitudes, and filter characteristics described herein may all be modified to suit the requirements of other positioning applications.

It will be obvious to skilled workers that many other changes may be made to the details of the above-described embodiments of this invention without departing from the underlying principles thereof. The scope of the present invention should, therefore, be determined only by the following claims.

We claim:

1. In a tool positioning system that is implemented as part of a workpiece processing system in which the workpieces are electronic devices or electronic device packages, the tool positioning system simultaneously positioning multiple tools relative to a set of target locations on multiple associated workpieces in response to a set of positioning commands, comprising:

a slow positioner stage effecting a large range of relative movement between the multiple tools and the multiple associated workpieces;

multiple fast positioner stages coupled to the slow positioner stage effecting small ranges of relative movement between the multiple tools and the multiple associated workpieces;

a positioning signal processor deriving from the set of positioning commands slow and fast movement-controlling signals;

a slow positioner driver controlling the large range of relative movement of the slow positioner stage in response to the slow movement-controlling signal; and multiple fast positioner drivers controlling the small ranges of relative movements of the associated fast positioner stages in response to the fast movement-controlling signal.

2. The apparatus of claim 1 in which at least one of the multiple tools is a laser beam having a first wavelength and at least one of the multiple tools is a laser beam having a second wavelength.

3. The apparatus of claim 1 in which the slow positioner stage includes an X-axis translation stage and a Y-axis translation stage and the multiple fast positioner stages are mounted on the X-axis translation stage.

4. The apparatus of claim 3 in which the multiple workpieces are mounted on the Y-axis translation stage.

5. The apparatus of claim 1 in which the slow and fast positioner stages coordinate their relative movements such that the multiple tools are rendered temporarily stationary relative to the multiple workpieces while the slow and fast positioner stages are moving.

6. The apparatus of claim 5 in which the multiple tools process the multiple associated workpieces during a time period when the multiple tools are rendered temporarily stationary relative to the multiple workpieces.

7. The apparatus of claim 1 in which the multiple associated workpieces each have a substantially identical set of calibration targets and the multiple workpieces are positioned such that the sets of calibration targets exhibit positioning errors from set to set, and the multiple fast positioner stages each have an associated fast stage signal processor that cooperates with the positioning signal processor to correct the small range of relative movement to compensate for the positioning error such that the multiple tools are simultaneously positionable to the set of target locations on the multiple associated workpieces.

8. The apparatus of claim 7 in which the positioning errors are caused by at least one of a linearity error and a scale factor error associated with the fast positioner stages.

9. The apparatus of claim 7 in which the positioning errors are caused by a dimensional error associated with at least one of the workpieces and the slow positioner stages.

10. The apparatus of claim 7 in which the positioning errors are caused by at least one of a rotational difference among any of the workpieces, an offset difference among any of the workpieces, a scale factor difference among any of the workpieces, an orthogonality error in any of the workpieces, and a trapezoidal distortion in any of the workpieces.

11. The apparatus of claim 7 further including video cameras that sense the sets of calibration targets on the multiple workpieces and provide difference data that are processed to compensate for the positioning errors.

12. In a tool positioning system that is implemented as part of a workpiece processing system in which the workpieces are electronic devices or electronic device packages, the tool positioning system carrying out a method for simultaneously positioning multiple tools relative to a set of target locations on multiple associated workpieces in response to a set of positioning commands, comprising:

providing a slow positioner stage for effecting a large range of relative movement between the multiple tools and the multiple associated workpieces;

mounting the multiple workpieces to the slow positioner stage;

providing multiple fast positioner stages for effecting small ranges of relative movement between the multiple tools and the multiple associated workpieces;

processing the set of positioning commands to generate slow and fast movement-controlling signals;

driving the slow positioner stage within the large range of relative movement in response to the slow movement-controlling signal;

driving the multiple fast positioner stages within the small ranges of relative movements in response to the fast movement-controlling signal; and coordinating the large and small ranges of relative movement such that the multiple tools are rendered temporarily stationary relative to the multiple workpieces during predetermined time periods when the slow and fast positioner stages are moving.

13. The method of claim 12 in which the workpieces are circuit boards and the multiple tools are laser beams, the method further including triggering the lasers beams during the predetermined time periods to cut holes in associated ones of the circuit boards.

14. The method of claim 13 in which the circuit boards have a thickness variation that is compensated for by a depth of field of each of the laser beams.

15. The method of claim 12 in which the slow positioner stage includes an X-axis translation stage and a Y-axis translation stage and the multiple fast positioner stages are mounted on the X-axis translation stage.

16. The method of claim 15 in which the multiple workpieces are mounted on the Y-axis translation stage.

17. The method of claim 12 further including:

identifying for each of the multiple workpieces a substantially identical set of calibration targets;

sensing the positioning of the sets of calibration targets to identify positioning errors from set to set;

processing the sensed positioning errors; and correcting the small ranges of relative movement to compensate for the positioning errors such that the multiple tools are simultaneously positionable to the set of target locations on the multiple associated workpieces.

18. The method of claim 17 in which the sensing step employs at least one video camera.

19. The method of claim 17 in which at least two calibration targets are identified and the positioning errors include rotation and offset variations among the multiple workpieces.

20. The method of claim 17 in which at least three calibration targets are identified and the positioning errors include rotation, offset, scale factor, and orthogonality variations among the multiple workpieces.

21. The method of claim 17 in which at least four calibration targets are identified and the positioning errors include rotation, offset, scale factor, orthogonality, and trapezoidal distortion variations among the multiple workpieces.

22. In a tool positioning system that is implemented as part of a workpiece processing system in which the workpieces are electronic circuit boards, the tool positioning system carrying out a method for cutting a predetermined hole pattern in at least first and second substantially identical circuit boards each having at least a first conductor layer, a dielectric layer, and a second conductor layer, comprising:

generating at least first and second laser beams having respective first and second wavelengths;

mounting the circuit boards on a slow positioner stage that effects a large range of relative movement between the laser beams and the circuit boards;

providing at least first and second fast positioner stages that are coupled to the slow positioner stage to effect small ranges of relative movement between the laser beams and associated ones of the circuit boards; and coordinating the large and small ranges of relative movement such that the first laser beam cuts the predetermined hole pattern in the first conductor layer of the first circuit board while the second laser beam cuts the predetermined hole pattern in the dielectric layer of the second circuit board.

23. The method of claim 22 further comprising:

generating slow and fast movement-controlling signals for positioning the lasers relative to the circuit boards in accordance with the predetermined hole pattern;

driving the slow positioner stage within the large range of relative movement in response to the slow movement-controlling signal; and driving the multiple fast positioner stages within the small ranges of relative movements in response to the fast movement-controlling signal.

24. The method of claim 22 in which the slow positioner stage includes an X-axis translation stage and a Y-axis translation stage and the multiple fast positioner stages are mounted on the X-axis translation stage.

25. The method of claim 24 in which the circuit boards are mounted on the Y-axis translation stage.

26. The method of claim 22 in which the first laser beam is generated by an ultraviolet laser and the second laser beam is generated by an infrared laser.

27. The method of claim 22 in which the first wavelength is less than about 355 nanometers and the second wavelength is in a range from about 1,000 nanometers to about 10,000 nanometers.

28. The method of claim 22 in which the coordinating step is carried out such that the first and second laser beams concurrently cut the first conductor layer of the first circuit board and the dielectric layer of the second circuit board.

29. The method of claim 22 further including:

identifying for each of the circuit boards a substantially identical set of calibration targets;

sensing the positioning of the sets of calibration targets to identify positioning errors associated with each of the circuit boards;

processing the sensed positioning errors; and correcting the small ranges of relative movement to compensate for the positioning errors such that each of the laser beams are accurately positionable to the predetermined hole pattern on an associated circuit board.

30. In a tool positioning system that is implemented as part of a workpiece processing system in which the workpieces are electronic circuit boards, the tool positioning system carrying out a method for cutting a predetermined hole pattern in a set of substantially identical circuit boards each having at least a first conductor layer, a dielectric layer, and a second conductor layer, comprising:

generating a first set of laser beams suitable for cutting the first conductor layer and a second set of laser beams suitable for cutting the dielectric layer;

mounting first and second subsets of the circuit boards on a slow positioner stage that effects a large range of relative movement between the laser beams and the circuit boards;

providing at least first and second fast positioner stages that are coupled to the slow positioner stage to effect small ranges of relative movement between the laser beams and associated ones of the circuit boards; and coordinating the large and small ranges of relative movement such that the first set of laser beams cut the predetermined hole pattern in the first conductor layers of the first subset of the circuit boards while the second set of laser beams concurrently cut the predetermined hole pattern in the dielectric layers of the second subset of the circuit boards.

31. The method of claim 30 further including performing a workpiece calibration process that comprises sensing calibration targets on each circuit board mounted on the slow positioner stage and correcting the small ranges of relative movement of associated ones of the fast positioner stages such that the predetermined hole pattern is accurately cut in each of the circuit boards.

32. The method of claim 30 further comprising:

removing the second subset of the circuit boards from the slow positioner stage;

remounting the first subset of the circuit boards on the slow positioner stage for cutting by the second set of laser beams;

mounting a third subset of the circuit boards on the slow positioner stage for cutting by the first set of laser beams; and repeating the coordinating step.

33. The method of claim 32 further including performing a workpiece calibration process before the repeating step.

34. The method of claim 33 further including repeating the removing, remounting, mounting a third subset, and coordinating steps until the entire set of circuit boards is processed.

* * * * *